United States Patent
Jeon et al.

(10) Patent No.: US 8,343,309 B2
(45) Date of Patent: *Jan. 1, 2013

(54) SUBSTRATE PROCESSING APPARATUS

(75) Inventors: Sang Jean Jeon, Suwon-si (KR); Chin Wook Chung, Seoul (KR); Guen Suk Lee, Suwon-si (KR); Seung Yuop Sa, Suwon-si (KR); Hyung Chul Cho, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 1458 days.

This patent is subject to a terminal disclaimer.

(21) Appl. No.: 11/735,549

(22) Filed: Apr. 16, 2007

(65) Prior Publication Data

US 2008/0017317 A1 Jan. 24, 2008

(30) Foreign Application Priority Data

Jul. 24, 2006 (KR) .................. 10-2006-0069332

(51) Int. Cl.
  *H01L 21/306* (2006.01)
  *C23C 16/00* (2006.01)
(52) U.S. Cl. ........... 156/345.48; 118/723 I; 118/723 AN
(58) Field of Classification Search ............... 118/723 I, 118/723 IR, 723 AN; 156/345.48, 345.49; 315/111.51
See application file for complete search history.

(56) References Cited

U.S. PATENT DOCUMENTS 5,571,366 A * 11/1996 Ishii et al. ................ 156/345.26
6,164,241 A * 12/2000 Chen et al. ................. 118/723 I
6,204,607 B1 * 3/2001 Ellingboe ................ 315/111.51
2003/0015965 A1 1/2003 Godyak
2004/0255864 A1 * 12/2004 Jeon et al. ............. 118/723.001
2005/0202183 A1 9/2005 Matsuda et al.
2007/0017446 A1 * 1/2007 Jeon et al. ............. 118/723.001
2008/0020574 A1 * 1/2008 Marakhtanov et al. ....... 438/689

FOREIGN PATENT DOCUMENTS

| CN | 1574199 | 2/2005 |
|---|---|---|
| EP | 0840365 | 5/1998 |
| JP | 2000-48997 | 2/2000 |
| JP | 2003-022977 | 1/2003 |
| JP | 2003-158119 | 5/2003 |
| KR | 2001-112958 | 12/2001 |

OTHER PUBLICATIONS

Japanese Office Action issued Aug. 17, 2009 in JP Application No. 2007-156466.
Chinese Office Action dated May 8, 2009 issued in CN 200710107773.X.
Chinese Office Action issued Mar. 11, 2010 in CN Application No. 200710107773.X.

* cited by examiner

*Primary Examiner* — Luz L. Alejandro
(74) *Attorney, Agent, or Firm* — Stanzione & Kim, LLP

(57) ABSTRACT

A substrate processing apparatus. The substrate processing apparatus includes a vacuum chamber having a reaction space to generate plasma in which a target substrate is located, a low frequency antenna unit located outside the reaction space to generate plasma in the reaction space, a low frequency power supply to apply low frequency power to the low frequency antenna unit, a high frequency antenna unit located outside the reaction space to generate plasma in the reaction space, and a high frequency power supply to apply high frequency power to the high frequency antenna unit. The apparatus allows the ignition of plasma to be performed efficiently via the high frequency antenna unit, and improves efficiency of inductive coupling between plasma and a low frequency antenna via the low frequency antenna unit, thereby improving plasma generation efficiency.

15 Claims, 8 Drawing Sheets

SUBSTRATE PROCESSING APPARATUS

CROSS-REFERENCE TO RELATED APPLICATIONS

This application claims priority under 35 U.S.C. §119(a) from Korean Patent Application No. 2006-0069332, filed on Jul. 24, 2006 in the Korean Intellectual Property Office, the disclosure of which is incorporated herein in its entirety by reference.

BACKGROUND OF THE INVENTION

1. Field of the Invention

The present general inventive concept relates to a substrate processing apparatus, and more particularly, to a substrate processing apparatus which employs a ferrite core to enhance plasma generation efficiency.

2. Description of the Related Art

A semiconductor wafer or a substrate (hereinafter, "substrate") for various display devices is produced by repetitiously performing various substrate treatment processes, such as deposition and etching of a thin film, on the substrate.

FIG. 1 is a cross-sectional view illustrating a conventional substrate processing apparatus, and FIG. 2 is a plan view illustrating the conventional processing apparatus.

A conventional substrate processing apparatus 100 comprises an upper vessel 111 and a lower vessel 112 coupled to each other. A space is defined by the two coupled vessels 111 and 112, and divided into an upper reaction space 113 and a lower reaction space 114 via partitions 121 and 122, respectively. After being injected into the upper reaction space 113 and the lower reaction space 114, a reaction gas is ionized to generate plasma therein. The upper and lower reaction spaces 113 and 114 are provided with an upper chuck 131 and a lower chuck 132, respectively. A substrate as a processing target is generally located only on the lower chuck 132. The conventional substrate processing apparatus 100 further comprises six toroidal ferrite cores 141 disposed circumferentially at equal intervals on a same plane at an intermediate position between the upper reaction space 113 and the lower reaction space 114. Each of the toroidal ferrite cores 141 has a coil 142 turned therearound such that the coil 142 around one ferrite core 141 is turned in an opposite direction to a turning direction of the coil 142 of an adjacent toroidal ferrite core 141 in order to cause adjacent toroidal ferrite cores 141 to generate induced electromotive forces having opposite phases.

The upper reaction space 113 and the lower reaction space 114 communicate with each other through a hole 152 formed in a tube 151 penetrating the center of each toroidal ferrite core 141. The reaction gas passes through the hole 152, each of which becomes a path of a discharge current. When processing the substrate, the coil 142 turned around each of the toroidal ferrite cores 141 acts as a primary side and the plasma acts as a secondary side so that a high frequency power applied to the coil 142 is transferred to the plasma of the secondary side. The induced electromotive forces generated by the adjacent toroidal ferrite cores 141 have a phase difference of 180 degrees with respect to each other, and a current path induced by the plasma constitutes a closed path through adjacent holes 152. Arrows of FIG. 2 indicate six electric currents induced between the adjacent holes 152.

In order to improve a plasma generation efficiency, it is necessary to form a path of the secondary side current induced by the plasma as a closed circuit. To this end, the conventional substrate processing apparatus 100 has the upper reaction space 113 and the lower reaction space 114. In the conventional processing apparatus 100, however, substrate processing is performed only on one side of the substrate, whereas plasma is generated on both sides, causing a reduction in plasma density and plasma generation efficiency.

SUMMARY OF THE INVENTION

The present general inventive concept provides a substrate processing apparatus which can improve plasma generation efficiency.

The present general inventive concept also provides a substrate processing apparatus which enables stable ignition of plasma while improving the plasma generation efficiency.

Additional aspects and advantages of the present general inventive concept will be set forth in part in the description which follows and, in part, will be obvious from the description, or may be learned by practice of the general inventive concept.

The foregoing and/or other aspects and utilities of the present general inventive concept are achieved by providing a substrate processing apparatus, including a vacuum chamber having a reaction space to generate plasma in which a target substrate is located, a low frequency antenna unit located outside the reaction space to generate plasma in the reaction space, a low frequency power supply to apply low frequency power to the low frequency antenna unit, a high frequency antenna unit located outside the reaction space to generate plasma in the reaction space, and a high frequency power supply to apply high frequency power to the high frequency antenna unit.

The low frequency antenna unit may be located at an outer periphery of a top surface of the vacuum chamber above the reaction space, and the high frequency antenna unit may be located at a central region of the top surface of the vacuum chamber above the reaction space.

The low frequency antenna unit may include a ferrite core comprising a plurality of poles positioned outside the reaction space and a connection part to connect the plurality of poles with each other, and an antenna coil turned around the plurality of poles.

The antenna coil of each pole may be turned in an opposite direction to a turning direction of the antenna coil of the adjacent poles.

The connection part may have an annular shape.

The plurality of poles connected with each other by the connection part may be arranged at constant intervals from each other.

The number of poles connected with each other by the connection part may be even.

The low frequency antenna unit may include an annular ferrite core located outside the reaction space and having a spiral-shaped insertion groove, and an antenna coil inserted into the insertion groove.

The spiral-shaped insertion groove may be circumferentially formed from an outer periphery to an inner periphery of the annular ferrite core.

The high frequency antenna unit may include a plurality of antenna coil groups connected in series, each of the antenna coil groups including a plurality of antenna coils connected in parallel.

The plurality of antenna coil groups may be disposed coaxially.

The high frequency antenna unit may include a single antenna coil turned in a spiral shape.

A low frequency power of 100 kHz to 2 MHz may be applied to the low frequency antenna unit, and a high frequency power of 13.56 MHz or more may be applied to the high frequency antenna unit.

The foregoing and/or other aspects and utilities of the present general inventive concept are also achieved by providing a substrate processing apparatus, including a chamber defining a reaction space to generate plasma, wherein a target substrate is located, a low frequency antenna unit located around an outer periphery of an outside surface of the chamber, and a high frequency antenna unit located on a central portion of an outside surface of the chamber.

The substrate processing apparatus may also include a low frequency power supply to apply a low frequency power to the low frequency antenna unit, and a high frequency power supply to apply a high frequency power to the high frequency antenna unit.

The surface in which the low frequency antenna unit is located may be a top surface of the chamber and may be above the reaction space, and the surface in which the high frequency antenna unit is located may be the top surface and the high frequency antenna unit may be located within a central portion of the low frequency antenna unit.

The low frequency antenna unit may include a ferrite core including a plurality of poles and a connection part to connect the plurality of poles to each other, and an antenna coil turned around the plurality of poles.

The low frequency antenna unit may include an annular ferrite core having a spiral-shaped insertion groove, and an antenna coil inserted into the insertion groove.

The ferrite core may have an annular shape.

The foregoing and/or other aspects and utilities of the present general inventive concept are also achieved by providing a substrate processing apparatus including a chamber defining a reaction space to generate plasma, a first antenna unit disposed at a first location on an outer surface of the chamber, and a second antenna unit disposed at a second location on the outer surface of the chamber.

The first antenna unit may be a low frequency antenna unit and the second antenna unit may be a high frequency antenna unit.

The first antenna unit may be disposed at an outer periphery of the outer surface of the chamber and the second antenna unit may be disposed at an inner portion of the outer surface of the chamber within a central region of the first antenna unit.

The foregoing and/or other aspects and utilities of the present general inventive concept are also achieved by providing a method of generating plasma within a reaction space, the method including introducing a reaction gas into the reaction space, wherein a high frequency antenna unit is located on a central portion of a first outside surface defining the reaction space, and a low frequency antenna unit is located on an outer periphery of a second outside surface defining the reaction space, applying a high frequency power to the high frequency antenna unit to ignite the reaction gas, thereby generating plasma at the center of the reaction space, and applying a low frequency power to the low frequency antenna unit to ignite the reaction gas, thereby generating plasma along an outer perimeter of the reaction space.

The first outside surface may correspond to the second outside surface and the high frequency antenna unit may be located within a central portion of the low frequency antenna unit.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
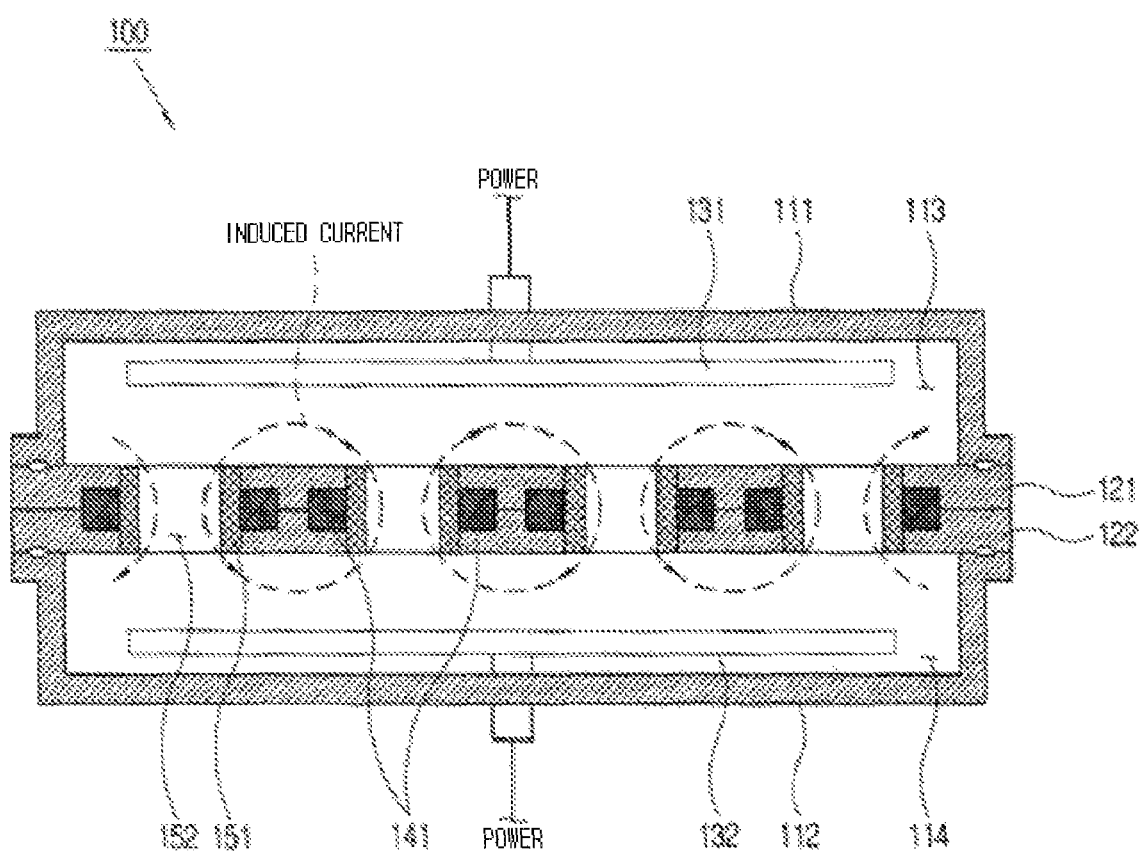
FIG. 1 is a cross-sectional view illustrating a conventional substrate processing apparatus.
Figure 2:
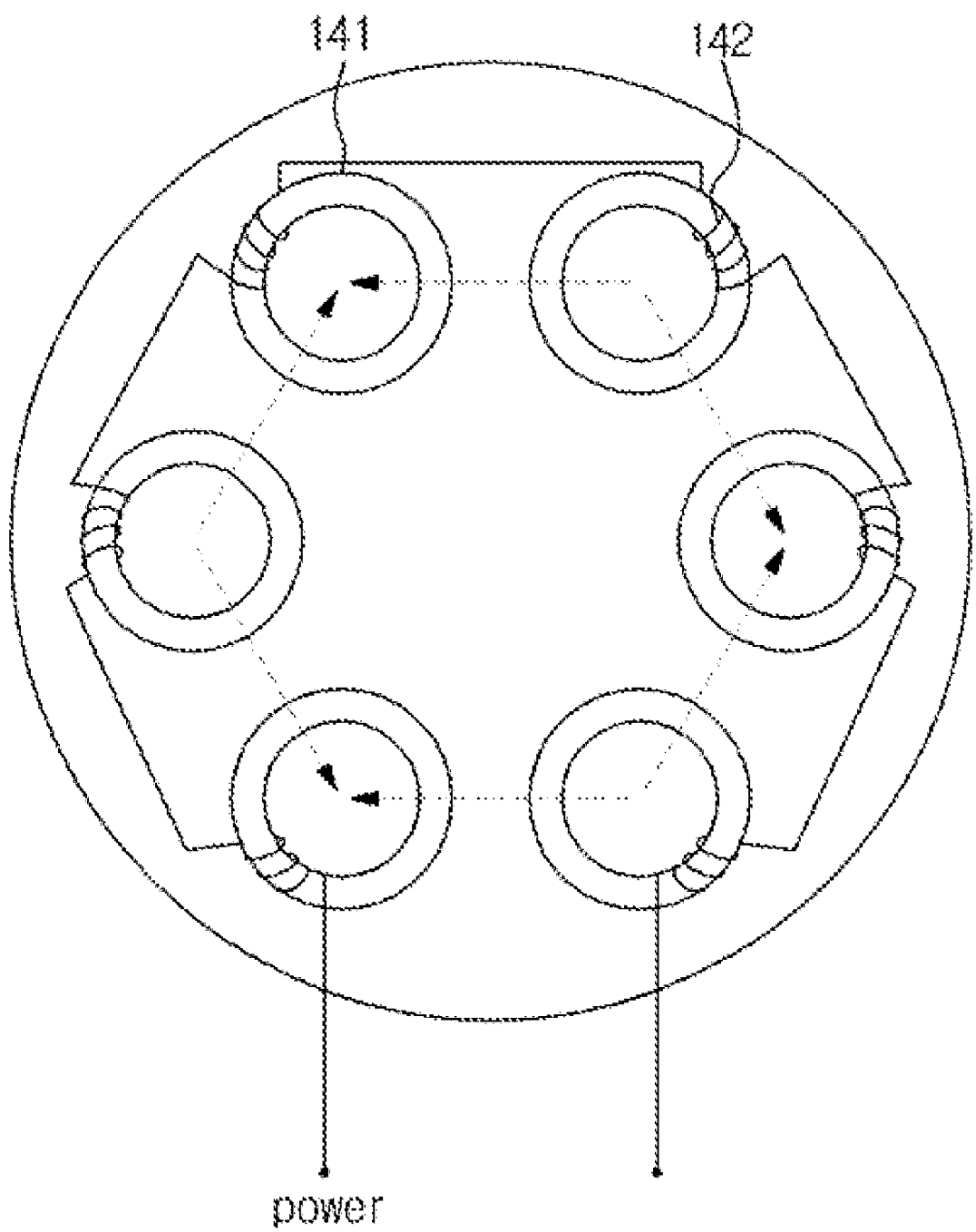
FIG. 2 is a plan view illustrating the conventional substrate processing apparatus.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

In recent years, corresponding to an increase in size of a substrate to improve a productivity of a plasma-based substrate processing apparatus, it has been required to provide a plasma source which can generate plasma with a high density and an excellent uniformity.

When an antenna system employs a high frequency power having a source frequency of about 13.56 MHz or more to generate a plasma, an increase in size of a plasma source causes deterioration in a uniformity of the plasma due to a transmission line effect. In this regard, since a low frequency power in the range of about 100 kHz to 2 MHz can eliminate the transmission line effect, the low frequency power is appropriate to develop a high density plasma source.

However, since an induced electromotive force E generated by an antenna to generate plasma is proportional to a magnetic field B of the antenna and a frequency w of a power, a power having a relatively low frequency causes a problem of deteriorating plasma generation efficiency.

Furthermore, since a vacuum chamber generally has various pressure conditions in respective steps of a process due to different types of reaction gas supplied into the vacuum chamber at the respective process steps, the lower frequency power makes it difficult to stably generate plasma in a plasma ignition stage so that the ignition of plasma cannot be performed efficiently.

A substrate processing apparatus according to the present general inventive concept comprises a low frequency antenna system and a high frequency antenna system in which the high frequency antenna system employs a high frequency power advantageous to ignite plasma under various conditions and to allow the ignition of plasma to be performed efficiently, and the low frequency antenna system comprises a ferrite core having a high magnetic permeability to improve an efficiency of inductive coupling between the plasma and the low frequency antenna to improve plasma generation efficiency.

Figure 3:
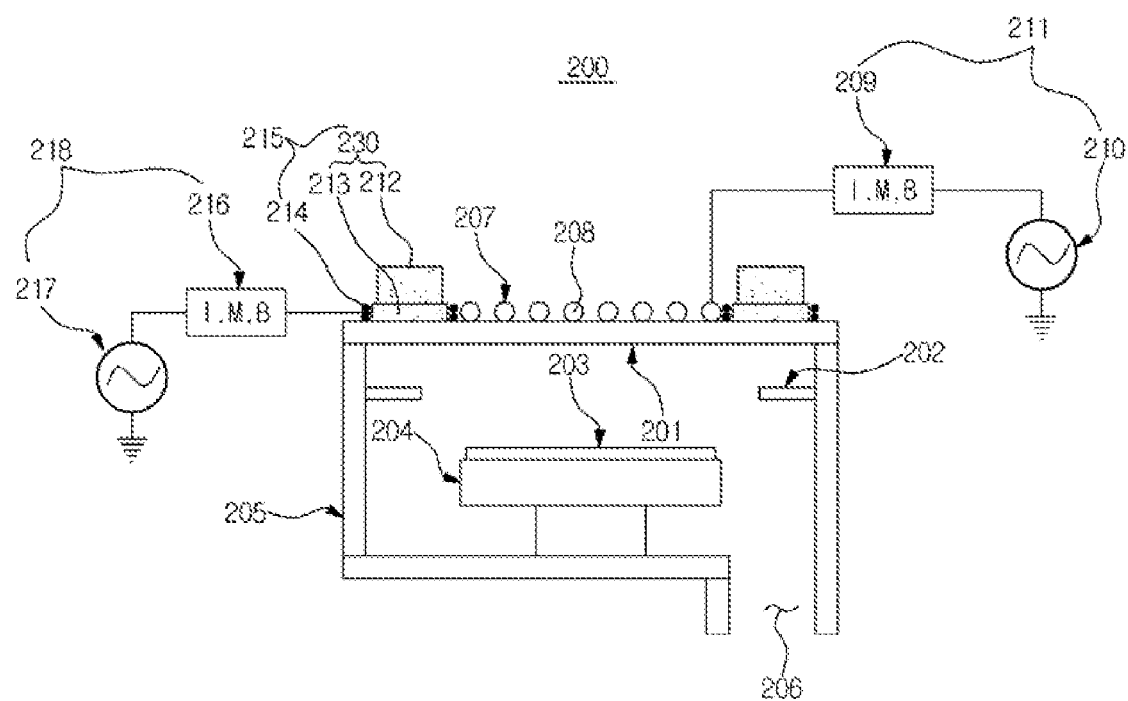
FIG. 3 is a cross-sectional view illustrating a substrate processing apparatus according to an embodiment of the present general inventive concept.
Figure 4:
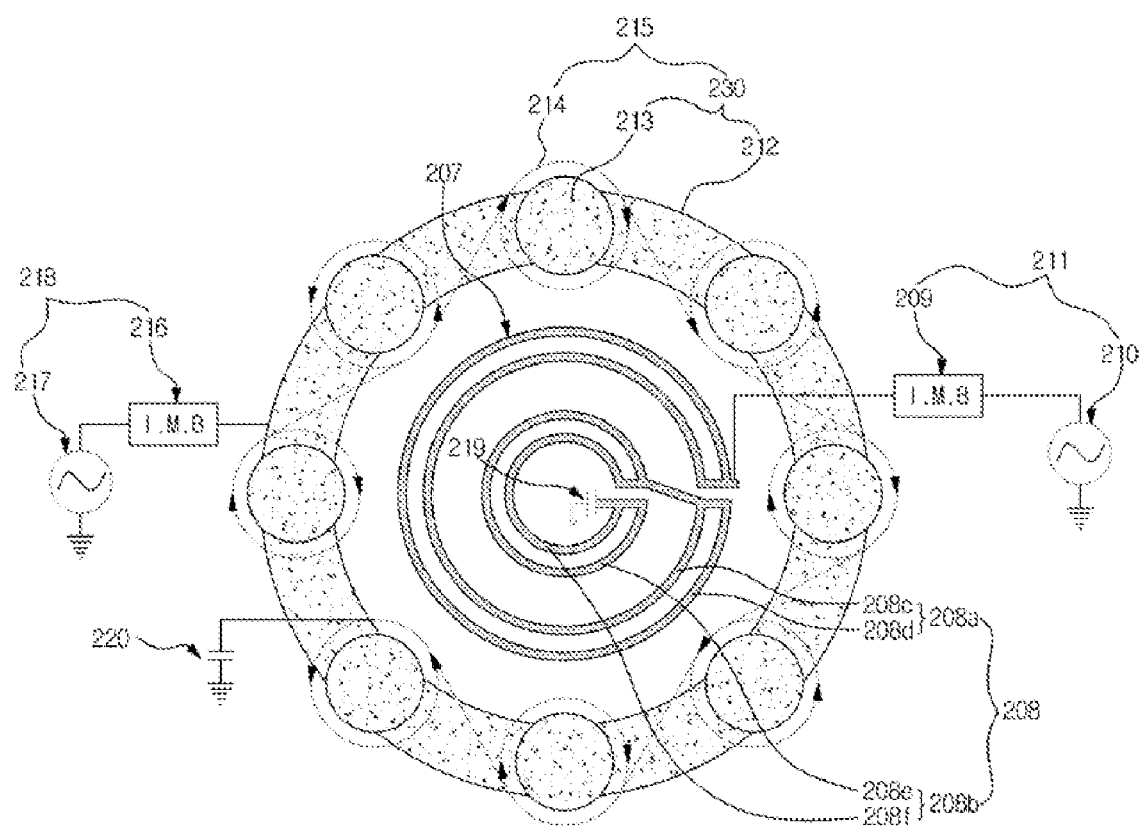
FIG. 4 is a plan view illustrating a low frequency antenna unit and a high frequency antenna unit of FIG. 3.
Figure 5:
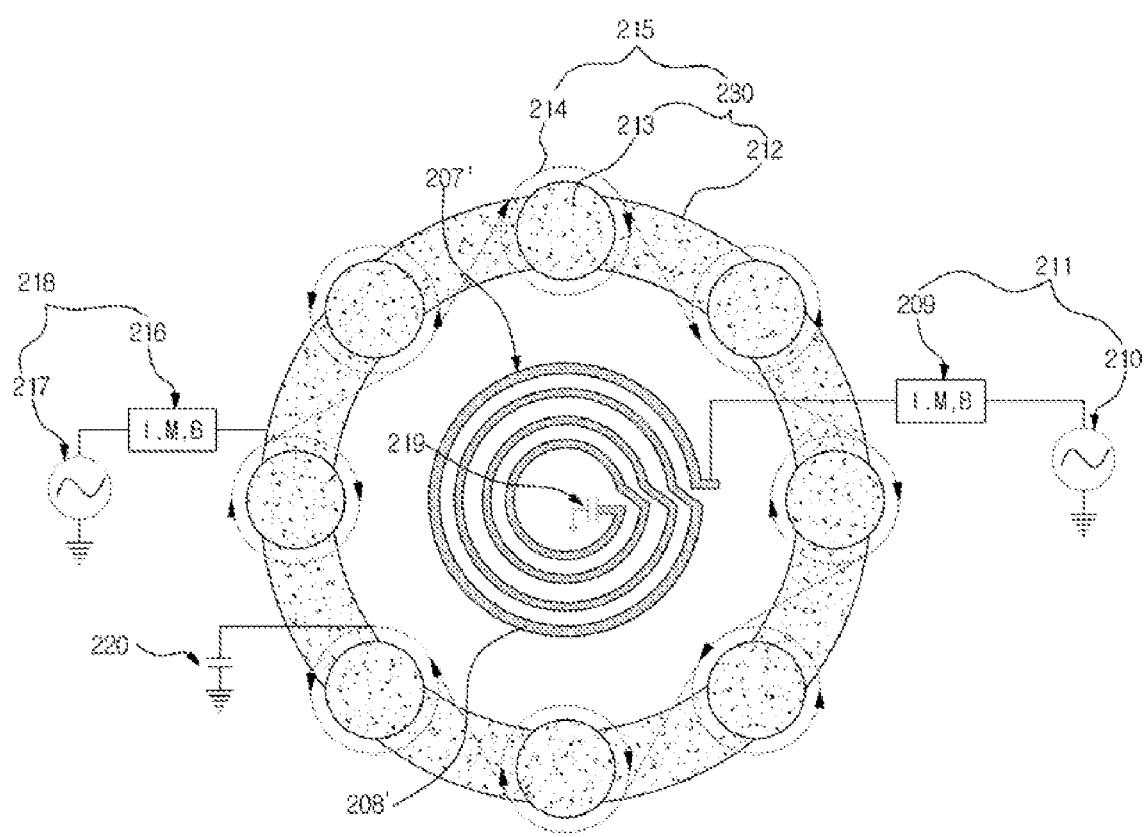
FIG. 5 is a plan view illustrating a modification of the high frequency antenna unit illustrated in FIG. 4.
Figure 6:
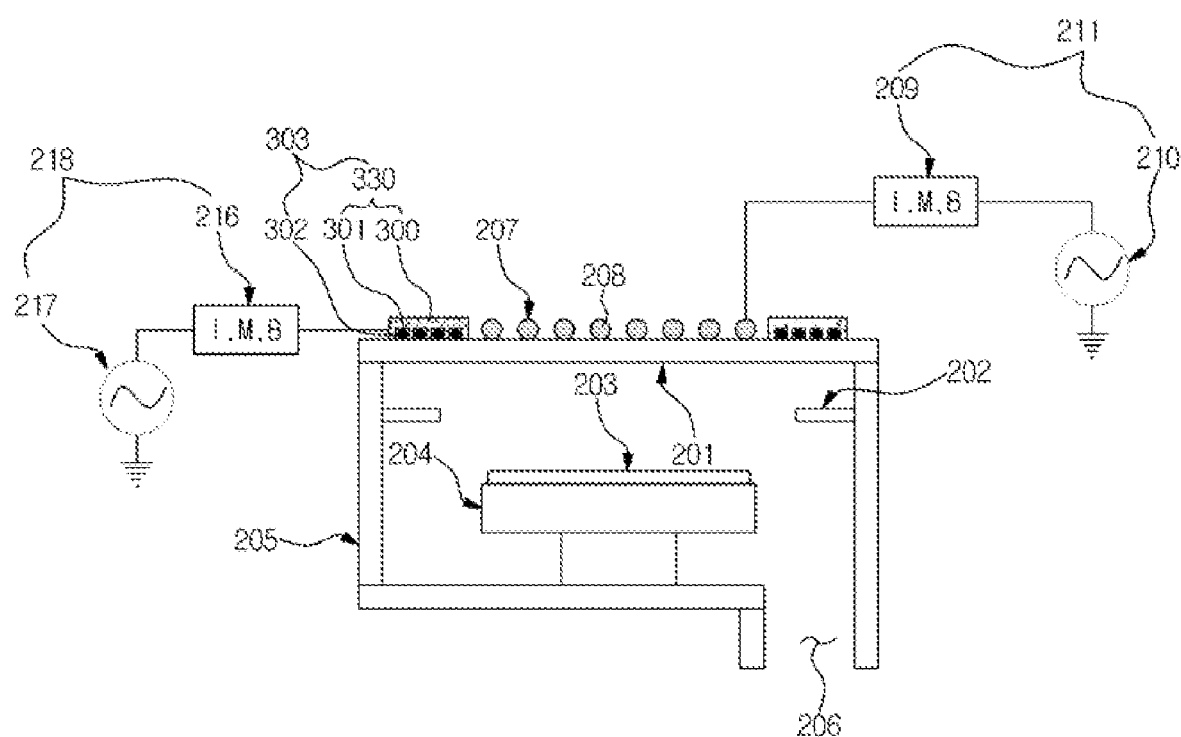
FIG. 6 is a cross-sectional view illustrating a substrate processing apparatus according to another embodiment of the present general inventive concept.

FIG. 3 is a cross-sectional view illustrating a substrate processing apparatus according to an embodiment of the present general inventive concept, FIG. 4 is a plan view illustrating a low frequency antenna unit and a high frequency antenna unit of FIG. 3, and FIG. 5 is a plan view illustrating a modification of the high frequency antenna unit illustrated in FIG. 4.

Referring to FIG. 3, a substrate processing apparatus 200 according to an embodiment of the present general inventive concept comprises a vacuum chamber 205 which defines a reaction space therein, a low frequency antenna unit 215 located at an outer periphery of a top surface of the vacuum chamber 205, a high frequency antenna unit 207 located at a central region of the top surface of the vacuum chamber 205, a low frequency power supply 218 to supply power to the low frequency antenna unit 215, and a high frequency power supply 211 to supply power to the high frequency antenna unit 207.

The vacuum chamber 205 defines the reaction space where plasma is generated and a target substrate 203 is processed, and serves to maintain the reaction space at a constant temperature in a vacuum.

A window plate 201 may be provided between the vacuum chamber 205 and the high frequency antenna unit 207 and the low frequency antenna unit 215. The window plate 201 may be composed of an insulating material such as alumina or quartz. The vacuum chamber 205 is equipped at a wall thereof with gas nozzles 202 through which a reaction gas is introduced from an external source (not illustrated) to the vacuum chamber 205. The reaction space is provided with a chuck 204 on which the target substrate 203 is placed. The vacuum chamber 205 is provided at a lower portion with a vacuum port 206 through which the reaction space is evacuated, and non-reacted gas, by-products, and the like are discharged to an outside of the vacuum chamber 205. Although not illustrated in the drawings, the vacuum port 206 may be connected to a vacuum pump.

The low frequency antenna unit 215 is positioned on the vacuum chamber 205 to face the reaction space, with the window plate 201 disposed between the low frequency antenna unit 215 and the reaction space, and comprises a ferrite core 230 and a low frequency antenna coil 214.

The ferrite core 230 comprises a plurality of poles 213 and a connection part 212 connecting the plurality of poles 213 with each other. The plurality of poles 213 are in contact with the top surface of the vacuum chamber 205, and the connection part 212 is located on the poles 213 to connect the poles 213 with each other. The low frequency antenna coil 214 is turned around each of the plurality of poles 213.

Referring to FIG. 4, the connection part 212 has a toroidal shape. The plurality of poles 213 are separated at constant intervals from each other in series. Each of the poles 213 has a cylindrical shape, and may have a diameter larger than a width of the connection part 212. The connection part 212 is connected to an even number of poles 213, for example, six poles 213.

An even number of poles 213 connected to the connection part 212 is provided to allow the low frequency antenna coil 214 of one pole 213 to be turned in an opposite direction to a turning direction of the low frequency antenna coil 214 of another adjacent pole 213. The low frequency antenna coil 214 has one end connected to the low frequency power supply 218, and the other end grounded. The low frequency antenna coil 214 is sequentially turned around the respective poles 213 connected to the connection part 212. The low frequency antenna coil 214 is turned in opposite directions for each pair of adjacent poles 213. In addition, since the number of poles 213 connected to the connection part 212 is even, the low frequency antenna coil 214 is turned in the opposite directions in every pair of adjacent poles 213.

The low frequency power supply 218 can include an impedance matching box 216 and a low frequency power source 217. The low frequency power supply 218 applies power of about 100 kHz to 2 MHz to the low frequency antenna coil 214. The impedance matching box 216 is provided between the low frequency power source 217 and the low frequency antenna coil 214, and serves to transmit power of the low frequency power source 217 to the low frequency antenna coil 214 without loss of power.

The low frequency antenna coil 214 can be grounded via the capacitor 220. The capacitor 220 serves to distribute a voltage applied to a power application point and a grounding point by controlling capacitance thereof.

As illustrated in FIG. 4, the high frequency antenna unit 207 is positioned within the ferrite core 230 of the low frequency antenna unit 215. The high frequency antenna unit 207 includes high frequency antenna coils 208. The high frequency antenna coils 208 include two groups of high frequency antenna coils 208a and 208b connected in series. The group of high frequency antenna coils 208a includes two high frequency antenna coils 208c and 208d connected in parallel and the group of high frequency antenna coils 208b includes two high frequency coils 208e and 208f also connected in parallel.

At this point, the two groups of high frequency antenna coils 208a and 208b are arranged coaxially. Although the two groups of high frequency antenna coils 208a and 208b are connected in series to each other, each group of high frequency antenna coils 208a and 208b includes the high frequency antenna coils 208c and 208d, and 208e and 208f, respectively, connected in parallel, thereby allowing a power to be supplied in parallel to the high frequency antenna coils 208. Hence, an impedance of the high frequency antenna coils 208 is significantly lowered in comparison to that of high frequency antenna coils connected in series, so that a voltage applied to the high frequency antenna coils 208 is lowered, thereby diminishing a possibility of arcing.

Alternatively, as illustrated in FIG. 5, a high frequency antenna unit 207' may comprise a single high frequency antenna coil 208' turned in a spiral shape.

The substrate processing apparatus 200 according to an embodiment of the present general inventive concept can further include a high frequency power supply 211 which includes an impedance matching box 209 and a high frequency power source 210. The high frequency power supply 211 applies a power of about 13.56 MHz or more to the high frequency antenna coils 208. The impedance matching box 209 is provided between the high frequency power source 210 and the high frequency antenna coils 208, and serves to transmit the power of the high frequency power source 210 to the high frequency antenna coils 208 without any loss.

The high frequency antenna coils 208 are grounded via a capacitor 219. The capacitor 219 serves to distribute a voltage applied to a power application point and a grounding point by controlling capacitance thereof.

Operation of the substrate processing apparatus according to an embodiment of the present general inventive concept will be described as follows.

First, when the high frequency power of about 13.56 MHz is applied to the high frequency antenna coils 208 of the high frequency antenna unit 207 in a plasma ignition stage, a current flowing through the high frequency antenna coils 208 causes generation of a magnetic field having a sine wave shape so that an induced electromotive force is generated in an opposite direction to that of the current flowing through the high frequency antenna coils 208 in the reaction space of the vacuum chamber 205. Then, a reaction gas is excited and ionized by the induced electromotive force within the reaction space of the vacuum chamber 205 so that plasma is ignited, thereby generating plasma at the center of the vacuum chamber 205. At this point, in order to generate the plasma along an outer perimeter of the vacuum chamber 205, a low frequency power must be applied to the low frequency antenna after igniting the plasma using the high frequency antenna.

Applying a low frequency power of about 100 kHz to 2 MHz to the low frequency antenna coil 214 of the low frequency antenna unit 215, a current flowing through the low frequency antenna coil 214 causes generation of a magnetic field having a sine wave shape as in the high frequency antenna coil 208, so that an induced electromotive force is generated in an opposite direction to that of the current flowing through the low frequency antenna coil 214 in the reaction space of the vacuum chamber 205. Then, the reaction gas is excited and ionized by the induced electromotive force within the vacuum chamber 205 so that the plasma is ignited, thereby generating plasma along an outer perimeter of the vacuum chamber 205. As a result, the target substrate 203 can be subjected to a thin film deposition or etching by plasma. At this point, the current flowing through the low frequency antenna coil 214 of the respective poles 213 has an opposite direction to a direction of an induced current by the respective pole 213. The magnetic field is generated between the pair of adjacent poles 213, and has an opposite direction to that of an adjacent magnetic field. In addition, magnetic flux lines are condensed via the connection part 212 between the adjacent poles 213, thereby preventing power from being transmitted above the connection part 212. As a result, the magnetic field is prevented from being lost due to an upper surrounding structure of the connection part 212, and increases in density in the reaction space, to improve the plasma generation efficiency even with the low frequency power.

Accordingly, with a low frequency antenna unit constructed according to an embodiment of the present general inventive concept, it is possible to eliminate a transmission line effect by applying power in a relatively low frequency band of about 100 kHz to 2 MHz thereto, thereby enabling generation of plasma having a high density and uniformity. In addition, with the ferrite core having high magnetic permeability, it is possible to improve an efficiency of inductive coupling between the low frequency antenna and the plasma, thereby enabling improvement of a plasma generation efficiency even with a relatively low frequency power.

Generally, the vacuum chamber 205 has various pressure conditions in respective steps of a substrate processing process due to different types of reaction gas supplied into the vacuum chamber 205 at the respective process steps. Thus, when employing only the low frequency antenna unit which employs the relatively low frequency power, it is difficult to stably generate plasma in the plasma ignition stage, causing a problem in that ignition of plasma cannot be efficiently performed.

In this regard, according to an embodiment of the present general inventive concept, even though the pressure condition of the vacuum chamber 205 may be changed according to the substrate process steps, the ignition of plasma can be stably performed under various pressure conditions by the high frequency antenna unit which employs high frequency power advantageous to ignite plasma. Furthermore, according to the present general inventive concept, it is possible to enhance a uniformity of plasma by controlling input power of the high and low frequency antenna units.

Each of the plurality of poles 213 may have a size smaller than a width of the connection part 212, and the poles 213 may have different sizes with regard to each other. While the connection part 212 is illustrated as the toroidal shape, such as a circular loop shape, the connection part 212 is not limited to this shape, and may have various shapes including a rectangular loop shape, a triangular loop shape, and a combination thereof in consideration of uniformity of plasma, design of a vacuum chamber, and the like.

Referring to FIG. 4, the ferrite core 230 of the low frequency antenna unit 215 has a plurality of poles 213.

However, if the ferrite core 230 has a plurality of poles 213, the ferrite core 230 is thickened, and may cause a difficulty in size reduction of the substrate processing apparatus, and a requirement of turning the low frequency antenna coil 214 around each of the plurality of poles 213 makes a manufacturing process difficult and results in an extended manufacturing time.

Figure 7:
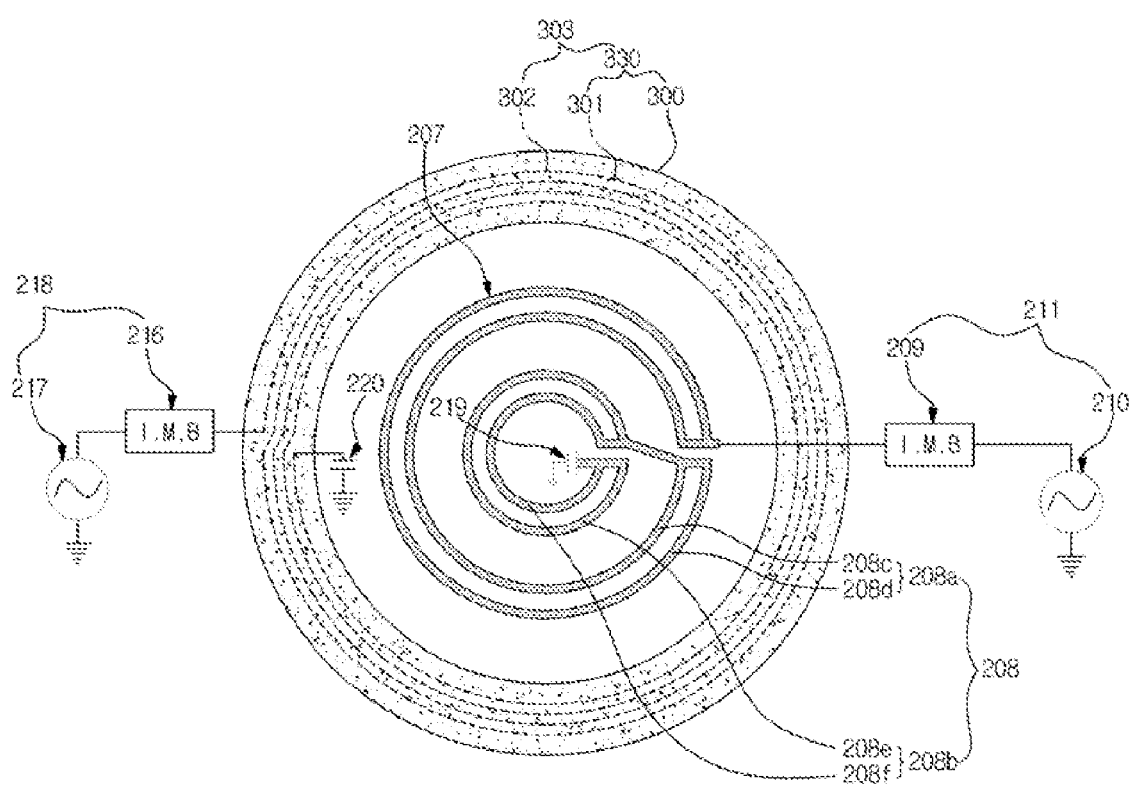
FIG. 7 is a plan view illustrating a low frequency antenna unit and a high frequency antenna unit of FIG. 6.

Referring to FIG. 7, in place of the ferrite core 230 including the plurality of poles 213 and a connection part 212, the substrate processing apparatus of the present general inventive concept may also be provided with a ferrite core 330 which comprises a connection part 300 having a spiral-shaped insertion groove 301 formed from an outer periphery to an inner periphery on an upper surface of the connection part 300 such that a low frequency antenna coil 302 can be inserted into the insertion groove 301.

Since this configuration is advantageous for size reduction of the substrate processing apparatus via thickness reduction of the ferrite core 330, and allows the low frequency antenna coil 302 to be easily mounted on the connection part 300 of the ferrite core 330, the manufacturing process thereof is easy, and the manufacturing time can be significantly reduced.

Figure 8:
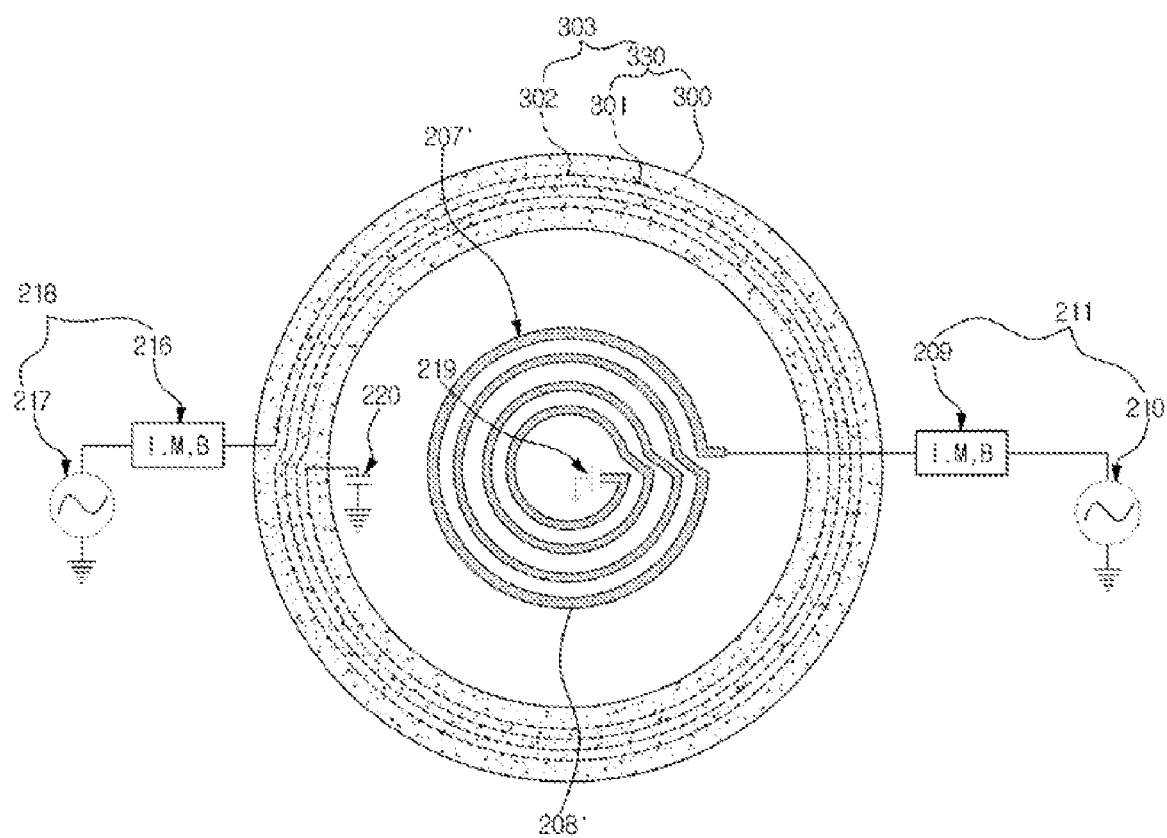
FIG. 8 is a plan view illustrating a modification of the high frequency antenna unit illustrated in FIG. 7.

Even according to this embodiment, a high frequency antenna unit 207 may include a high frequency antenna coils 208 including two groups of high frequency antenna coils 208a and 208b connected in series while being disposed coaxially, in which each of the high frequency antenna coils group 208a and 208b includes two high frequency antenna coils 208c and 208d and 208e and 208f, respectively, connected in parallel. Alternatively, a high frequency antenna unit 207' may include a single antenna coil 208' turned in a spiral shape, as illustrated in FIG. 8.

A substrate processing apparatus according to the present general inventive concept includes a low frequency antenna system and a high frequency antenna system in which the high frequency antenna system employs high frequency power advantageous for ignition of plasma under various conditions to allow the ignition of plasma to be performed efficiently, and the low frequency antenna system includes a ferrite core having a high magnetic permeability to improve an efficiency of inductive coupling between plasma and a low frequency antenna, thereby improving plasma generation efficiency. Hence, the substrate processing apparatus according to the present general inventive concept is appropriate for generation of plasma having high uniformity for a large size substrate.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A substrate processing apparatus, comprising:
a vacuum chamber having a reaction space to generate plasma in which a target substrate is located;
a low frequency antenna unit located outside the reaction space to generate plasma in the reaction space, the low frequency antenna unit comprising a ferrite core including a plurality of poles each arranged vertically on the vacuum chamber and a ferrite connection part to connect the plurality of poles with each other, and an antenna coil turned around each of the plurality of poles;
a low frequency power supply to apply low frequency power to the low frequency antenna unit;
a high frequency antenna unit located outside the reaction space to generate plasma in the reaction space, the high frequency antenna unit comprising a plurality of antenna coil groups connected in series, each of the antenna coil groups comprising a plurality of antenna coils connected in parallel; and
a high frequency power supply to apply high frequency power to the high frequency antenna unit.

2. The apparatus according to claim 1, wherein the low frequency antenna unit is located at an outer periphery of a top surface of the vacuum chamber above the reaction space, and the high frequency antenna unit is located at a central region of the top surface of the vacuum chamber above the reaction space.

3. The apparatus according to claim 1, wherein the antenna coil of each pole is turned in an opposite direction to a turning direction of the antenna coil of the adjacent poles.

4. The apparatus according to claim 1, wherein the connection part has an annular shape.

5. The apparatus according to claim 1, wherein the plurality of poles connected with each other by the connection part are arranged at constant intervals from each other.

6. The apparatus according to claim 5, wherein the number of poles connected with each other by the connection part is even.

7. The apparatus according to claim 1, wherein the plurality of antenna coil groups are disposed coaxially.

8. The apparatus according to claim 1, wherein a low frequency power of 100 kHz to 2 MHz is applied to the low frequency antenna unit, and a high frequency power of 13.56 MHz or more is applied to the high frequency antenna unit.

9. A substrate processing apparatus, comprising:
a chamber defining a reaction space to generate plasma, wherein a target substrate is located;
a low frequency antenna unit located around an outer periphery of an outside surface of the chamber, the low frequency antenna unit comprising a ferrite core including a plurality of poles each vertically arranged on the chamber and a ferrite connection part to connect the plurality of poles to each other, and an antenna coil turned around each of the plurality of poles; and
a high frequency antenna unit located on a central portion of an outside surface of the chamber, the high frequency antenna unit comprising a plurality of antenna coil groups connected in series, each of the antenna coil groups comprising a plurality of antenna coils connected in parallel.

10. The substrate processing apparatus of claim 9, further comprising:
a low frequency power supply to apply a low frequency power to the low frequency antenna unit; and
a high frequency power supply to apply a high frequency power to the high frequency antenna unit.

11. The substrate processing apparatus of claim 9, wherein the surface in which the low frequency antenna unit is located is a top surface of the chamber and is above the reaction space, and the surface in which the high frequency antenna unit is located is the top surface and the high frequency antenna unit is located within a central portion of the low frequency antenna unit.

12. The substrate processing apparatus of claim 9, wherein the ferrite core has an annular shape.

13. A substrate processing apparatus, comprising:
a chamber defining a reaction space to generate plasma;
a first antenna unit disposed at a first location on an outer surface of the chamber, the first antenna unit comprising a ferrite core including a plurality of poles each vertically arranged on the chamber and a ferrite connection part to connect the plurality of poles to each other, and an antenna coil turned around each of the plurality of poles; and
a second antenna unit disposed at a second location on the outer surface of the chamber, the second antenna unit comprising a plurality of antenna coil groups connected in series, each of the antenna coil groups comprising a plurality of antenna coils connected in parallel.

14. The substrate processing apparatus of claim 13, wherein the first antenna unit is a low frequency antenna unit and the second antenna unit is a high frequency antenna unit.

15. The substrate processing apparatus of claim 14, wherein the first antenna unit is disposed at an outer periphery of the outer surface of the chamber and the second antenna unit is disposed at an inner portion of the outer surface of the chamber within a central region of the first antenna unit.

* * * * *